(12) United States Patent
Yang et al.

(10) Patent No.: US 10,782,614 B2
(45) Date of Patent: Sep. 22, 2020

(54) EDGE EXPOSURE DEVICE AND METHOD

(71) Applicant: SHANGHAI MICRO ELECTRONICS EQUIPMENT (GROUP) CO., LTD., Shanghai (CN)

(72) Inventors: Jinguo Yang, Shanghai (CN); Wenli Tang, Shanghai (CN); Gang Wang, Shanghai (CN); Xinke Lang, Shanghai (CN); Jiaozeng Zheng, Shanghai (CN)

(73) Assignee: SHANGHAI MICRO ELECTRONICS EQUIPMENT (GROUP) CO., LTD., Shanghai (CN)

( * ) Notice: Subject to any disclaimer, the term of this patent is extended or adjusted under 35 U.S.C. 154(b) by 63 days.

(21) Appl. No.: 16/314,199

(22) PCT Filed: Jun. 30, 2017

(86) PCT No.: PCT/CN2017/091008
§ 371 (c)(1),
(2) Date: Dec. 28, 2018

(87) PCT Pub. No.: WO2018/001347
PCT Pub. Date: Jan. 4, 2018

(65) Prior Publication Data
US 2020/0089119 A1      Mar. 19, 2020

(30) Foreign Application Priority Data

Jun. 30, 2016  (CN) .......................... 2016 1 0506802

(51) Int. Cl.
*G03F 7/20* (2006.01)
*G03F 9/00* (2006.01)
*H01L 21/027* (2006.01)
*H01L 21/677* (2006.01)
*H01L 21/68* (2006.01)

(52) U.S. Cl.
CPC ........ *G03F 7/2022* (2013.01); *G03F 7/70775* (2013.01); *G03F 9/7046* (2013.01);
(Continued)

(58) Field of Classification Search
CPC .. G03F 7/2022; G03F 7/2028; G03F 7/70275; G03F 7/70775; G03F 9/7011;
(Continued)

(56) References Cited

U.S. PATENT DOCUMENTS 5,168,304 A * 12/1992 Hattori .................. G03F 7/2022
355/50
5,811,211 A * 9/1998 Tanaka ................ G03F 7/70066
382/145

(Continued)

FOREIGN PATENT DOCUMENTS

| CN | 101201555 A | 6/2008 |
|----|-------------|--------|
| CN | 101498897 A | 8/2009 |

(Continued)

*Primary Examiner* — Colin W Kreutzer
(74) *Attorney, Agent, or Firm* — Muncy, Geissler, Olds & Lowe, P.C.

(57) ABSTRACT

An edge exposure apparatus and method are disclosed. The edge exposure apparatus includes: a base frame (1); an edge exposure unit (2) mounted on the base frame and configured to perform an edge exposure process on a wafer; a pre-alignment unit (3) for centering and orienting the wafer and cooperating with the edge exposure unit (2) in the edge exposure process; a cassette unit (4) for storing and detecting the wafer; a robotic arm (5) for transferring the wafer; and a master control unit (6) for controlling the above components of the edge exposure apparatus. The edge exposure unit (2) and the pre-alignment unit (3) share a common worktable, resulting in structural compactness. Alternatively, two pre-alignment units (3) and two edge exposure units (2) may be included in order to increase processing efficiency.

10 Claims, 12 Drawing Sheets

(52) U.S. Cl.
CPC ...... *H01L 21/027* (2013.01); *H01L 21/67742* (2013.01); *H01L 21/682* (2013.01)

(58) Field of Classification Search
CPC .................. G03F 9/7046; H01L 21/027; H01L 21/67225; H01L 21/67276; H01L 21/673; H01L 21/67742; H01L 21/68; H01L 21/681; H01L 21/682; H01L 21/68764; H01L 21/68785
USPC .......................................... 355/30, 53, 67, 77
See application file for complete search history.

(56) References Cited

U.S. PATENT DOCUMENTS

| | | | | |
|---|---|---|---|---|
| 5,880,816 A | * | 3/1999 | Mimura | G03F 7/2028 355/53 |
| 2005/0248754 A1 | * | 11/2005 | Wang | G03F 9/7011 356/150 |
| 2010/0075054 A1 | | 3/2010 | Kaneyama et al. | |
| 2017/0345696 A1 | * | 11/2017 | Wang | H01L 21/67706 |

FOREIGN PATENT DOCUMENTS

| | | | | |
|---|---|---|---|---|
| CN | 102157421 A | | 8/2011 | |
| CN | 202534640 U | | 11/2012 | |
| CN | 102842485 A | | 12/2012 | |
| CN | 105372941 A | | 3/2016 | |
| CN | 105632971 A | | 6/2016 | |
| JP | 58139144 A | * | 8/1983 | ......... G03F 7/70691 |
| JP | H3153020 A | | 7/1991 | |
| JP | 05343294 A | * | 12/1993 | ......... G03F 7/70691 |
| JP | H5343294 A | | 12/1993 | |
| JP | H8335545 A | | 12/1996 | |
| JP | 2013179257 A | | 9/2013 | |
| KR | 20030006828 A | * | 1/2003 | |
| KR | 20040079493 A | * | 9/2004 | |
| TW | 200801834 A | | 1/2008 | |
| WO | WO 0182001 A1 | | 11/2001 | |

\* cited by examiner

Edge Exposure Unit 2
- Light Source 21
- Fiber Optic Cable 22
- Light Homogenizer 23
- Exposure Assembly 24

EDGE EXPOSURE DEVICE AND METHOD

TECHNICAL FIELD

The present invention relates to the field of exposure and, in particular, to an edge exposure apparatus and method.

BACKGROUND

Electroplating is one important back-end IC packaging process, in which a direct current is applied between the edge of a wafer, which serves as an anode, and a plating window at a center of the wafer, which acts as a cathode, and heights of the resulting metal bumps are controlled by adjusting the magnitude of the current and the concentration of a plating solution in a plating tank.

Due to the non-conductive nature of photoresist, it is necessary to remove photoresist near the wafer edge before electroplating. The width of photoresist to be removed depends on a wafer edge exclusion (WEE) width of a previous exposure process. There are a large number of traditional WEE methods which can be generally divided into two groups: chemical WEE and edge exposure. Chemical WEE is accomplished by, during photoresist coating of a wafer, spraying a solvent on its edge so as to remove photoresist coated thereon. This approach suffers from several drawbacks such as a long process cycle, high cost due to the expensive solvent, and proneness of the solvent to be sprayed on the central pattern area of the wafer and thus significantly degrade pattern quality. In an edge exposure method, a wafer is vacuum-absorbed onto a rotary table, with a set of UV exposure lenses being arranged above the edge of the wafer and each configured to produce a uniform light spot of a certain size. Rotation of the rotary table allows the edge of the wafer to be exposed. Compared to chemical WEE, edge exposure offers a variety of advantages such as higher productivity, lower equipment cost and easier process control.

During edge exposure, the wafer is pre-aligned after it is transferred onto the rotary table in order to eliminate possible errors occurring during the transfer that is conducted in a random manner, so as to achieve centering and notch orienting of the wafer. The centering is a process to move the wafer so that its centroid coincides with a centroid of the rotary table. The orienting is a process to rotate the wafer to align its notch with a predetermined position. These processes ensure the wafer to be exposed on the exposure table at a fixed position. The pre-alignment is a precise positioning of the wafer prior to the edge exposure, and its precision has a direct impact on the efficiency of the whole wafer processing apparatus.

Recently, the requirements from the market on pre-alignment and edge exposure, as well as on their degrees of automation, are getting more and more critical. Pre-alignment capabilities are required to handle not only a variety of wafer types such as through-hole wafers, warped wafers and ultra-thin wafers but also 8/12-inch wafers. Edge exposure capabilities are required to enable not only multiple exposure modes such as edge exposure, annular exposure, segment-wise exposure and linear exposure but also exposure field of view (FoV) adjustment and exposure energy monitoring. Moreover, increasing lower cost wafer processing apparatuses are also in demand.

In the state of art, wafer pre-alignment and edge exposure are usually accomplished using two separate devices equipped with respective independent control systems, which take up large space. In addition, as there are many objects that need to be controlled and simultaneous control of motion axes including switching, rotation, lifting and centering axes is needed, the associated pre-alignment methods are tedious and the systems are complex, high-energy consuming and costly.

SUMMARY OF THE INVENTION

The present invention provides a structurally compact edge exposure apparatus and a corresponding edge exposure method capable of pre-alignment and edge exposure of a wafer with high processing efficiency.

To this end, the edge exposure apparatus provided herein includes: a base frame; an edge exposure unit mounted on the base frame and configured to perform an edge exposure process on a wafer; a pre-alignment unit for centering and orienting the wafer and cooperating with the edge exposure unit in the edge exposure process; a cassette unit for storing and detecting the wafer; a robotic arm for transferring the wafer; and a master control unit for controlling the above units, wherein the edge exposure unit and the pre-alignment unit share a common worktable.

Preferably, the edge exposure unit includes a light source, a fiber optic cable, a light homogenizer and an exposure assembly which are disposed along a direction in which light propagates.

Preferably, the exposure assembly includes:

a motion switching/adjusting mechanism, having freedoms of movement in horizontal X and Y directions;

an exposure lens mounted on the motion switching/adjusting mechanism, the exposure lens configured to perform the edge exposure process on the wafer;

an absolute light intensity detection mechanism mounted on the motion switching/adjusting mechanism, the absolute light intensity detection mechanism configured for verification and validation of a light intensity in an area being exposed;

an exposure dose measuring mechanism mounted on the motion switching/adjusting mechanism, the exposure dose measuring mechanism configured to monitor an illuminance during the edge exposure process; and a diaphragm switching mechanism disposed in positional correspondence with the exposure lens, wherein the motion switching/adjusting mechanism is configured to switch the wafer between an exposure mode and a pre-alignment mode and to enable translational movement of the wafer.

Preferably, the motion switching/adjusting mechanism includes a motion module mount, a planar motion module mounted on the motion module mount as well as a towline assembly and a module adapter plate both coupled to the planar motion module, wherein the exposure lens is mounted on the module adapter plate, and the module adapter plate has freedoms of movement in the horizontal X and Y directions.

Preferably, the absolute light intensity detection mechanism includes a cylinder adapter, a switching cylinder, a sensor mount and a light intensity sensor, the switching cylinder coupled to the motion module mount through the cylinder adapter, the light intensity sensor coupled to the switching cylinder through the sensor mount and aligned with a field of view of the exposure lens.

Preferably, the exposure dose measuring mechanism includes an adjusting/mounting plate, a pinhole, a filter and an illuminance sensor, the illuminance sensor fastened to the module adapter plate through the adjusting/mounting plate, the pinhole and the filter disposed between the adjusting/mounting plate and the illuminance sensor.

Preferably, the diaphragm switching mechanism includes a linear motion module in fixed connection with the module adapter plate, a guiding block disposed on the linear motion module and a masking diaphragm coupled to the guiding block, the masking diaphragm disposed on the exposure lens.

Preferably, the pre-alignment unit includes a mechanical vision system, a rotary table and a centering/orienting member, the rotary table disposed on the centering/orienting member and configured to support the wafer, the mechanical vision system in positional correspondence with the rotary table.

Preferably, two edge exposure units and two pre-alignment units are included.

The provided edge exposure method uses the edge exposure apparatus as defined above and includes: taking out a wafer from a cassette unit and placing the wafer onto a pre-alignment unit, by a robotic arm; centering and orienting the wafer by the pre-alignment unit; performing an edge exposure process on the centered and oriented wafer by an edge exposure apparatus; and removing the exposed wafer.

Preferably, centering and orienting the wafer by the pre-alignment unit includes:

obtaining, by fitting, a centroid of the wafer by scanning and sampling a circumferential edge of the wafer;

locating and sampling a notch in the wafer and thereby obtaining, by fitting, a center of the notch;

moving the notch, by rotation, to a predetermined position, such that a line leading from the centroid of the wafer toward the center of the notch is parallel to a positive X direction, and determining an offset of the centroid of the wafer; and compensating for the offset of the centroid of the wafer by adjusting the wafer.

Preferably, in the step of performing the edge exposure process on the centered and oriented wafer by the edge exposure apparatus, an actual expose dose applied to a surface of the wafer is estimated by edge exposure residual light collection and cumulative calculation, and wherein the actual expose dose serves as a basis for determining whether the edge exposure process has encountered an abnormality, and if so, an alert is raised.

The present invention offers the following advantages over the prior art:

1. It allows the exposure of an edge portion of a wafer with a certain width in an annular or segment-wise manner as well as linear exposure of a certain area thereof with an exposure width that is adjustable online in an automated manner.

2. The edge exposure unit is capable of transferring wafers sized from 8 inch to 12 inch and is freely switchable between the corresponding modes for exposing such wafers.

3. It is equipped with systems respectively for real-time exposure dose monitoring and online light intensity detection and is thus capable of both online detection and real-time monitoring.

4. The pre-alignment unit and the edge exposure unit share a common worktable (i.e., a pre-alignment/exposure table), resulting in structural compactness.

5. Two pre-alignment units and two edge exposure units may be equipped to increase processing efficiency.

DETAILED DESCRIPTION OF PREFERRED EMBODIMENTS

The above objectives, features and advantages of the present invention will become more apparent and better understood from the following detailed description of specific embodiments thereof, which is to be read in connection with the accompanying drawings. It is noted that these figures are provided in a very simplified form not necessarily presented to scale, with the only intention of ease and clarity of explanation in describing the embodiments.

Figure 1:
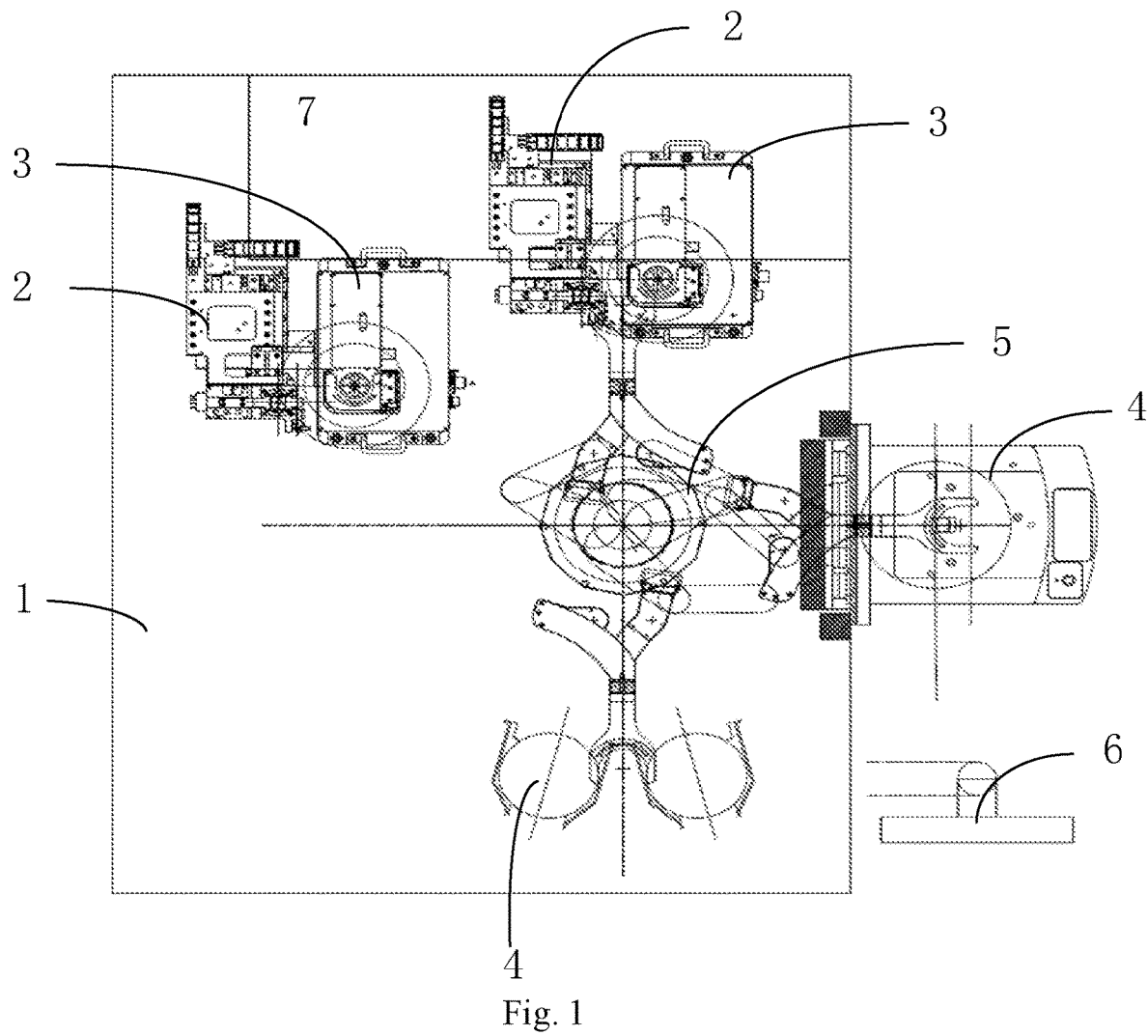
FIG. 1 is a structural schematic of an edge exposure apparatus according to a particular embodiment of the present invention.

As shown in FIG. 1, the present invention provides an edge exposure apparatus including: a base frame 1; edge exposure units 2 mounted on the base frame 1 and configured to perform an edge exposure process on a wafer; pre-alignment units 3 for centering and orienting the wafer and cooperating with the edge exposure unit 2 in the edge exposure process; a cassette unit 4 for storing and detecting the wafer; a robotic arm 5 for transferring the wafer; and a master control unit 6 for coordinating the above components in the edge exposure apparatus. The number of the edge exposure units 2 and that of the pre-alignment units 3 are both two. The edge exposure units 2 and the pre-alignment units 3 share a common worktable. That is to say, the pre-alignment table used by the pre-alignment units 3 and the exposure table used by the edge exposure units 2 are on the same worktable. This results in structural compactness and high processing efficiency.

The base frame 1 may include a protective frame assembly, a protective panel assembly mounted on the protective frame assembly, and a connecting plate assembly disposed within a space delimited by the above two assemblies. The protective frame assembly provides a fixed support base for the installation and protection of the whole system and constitutes, along with the protective panel assembly, a protective module for the whole system, which fulfills protection, support and maintenance functionalities for the whole system and its various sub-systems.

The master control unit 6 is configured for electrical control of components including the robotic arm 5, the pre-alignment units 3, the edge exposure units 2 and the cassette units 4. Preferably, the master control unit 6 may include a console and a computer system enabling either local or remote control. The user may operate and control the edge exposure apparatus via a user interface of a local console, or remotely assess and control it via an Ethernet connection to an interface on the factory ground where the apparatus is installed. Control of the system's beacon and fault buzzer may be implemented with a combination of software and hardware, with the computer system providing a hardware control interface necessary for software control.

With continued reference to FIG. 1, the edge exposure apparatus may further include a power supply unit 7. The power supply unit 7 is mainly configured to power the above components and providing them with individual leakage current protectors to maximize the stability of the system's basic environment.

Figures 2, 3:
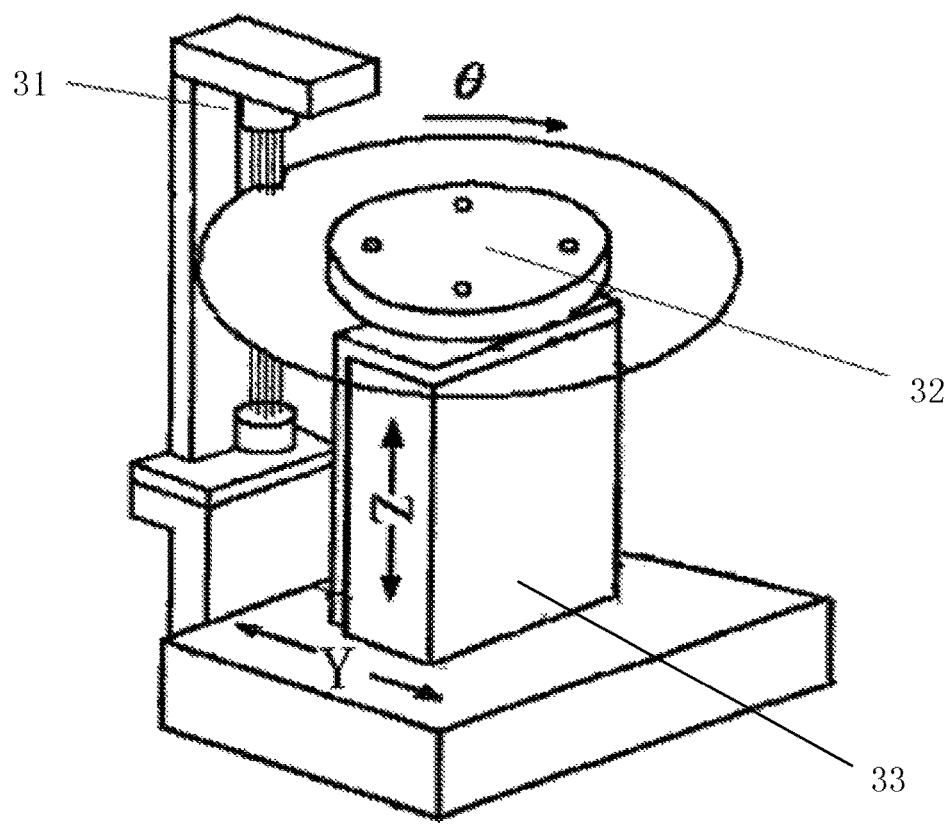
FIG. 2 is a structural schematic of a pre-alignment unit according to a particular embodiment of the present invention.
FIG. 3 is a structural schematic of an edge exposure unit according to a particular embodiment of the present invention.

With particular reference to FIG. 2, the pre-alignment units 3 for centering and orienting the wafer and cooperating with the edge exposure unit in the edge exposure process may each include, in particular, a mechanical vision system 31, a rotary table 32 and a centering/orienting member 33. The mechanical vision system 31 may employ an LED light source and a linear CCD for obtaining, by fitting, the wafer's centroid by scanning and sampling its circumferential edge and for identifying a center of the wafer's notch by coarse location and fine sampling of the notch. The rotary table 32 may be adapted to retain the wafer by vacuum suction. The centering/orienting member 33 may have freedom of movement in the X (horizontal), Z (vertical) and Rz (rotational about Z) directions. The rotary table 32 may work with the centering/orienting member 33 to orient the wafer's notch to a desired position and compensate for eccentricity of its centroid from the rotary table 32.

Referring to FIG. 3, each of the edge exposure units 2 may essentially include, disposed along a direction in which light propagates, a light source 21, a fiber optic cable 22, a light homogenizer 23 and an exposure assembly 24. The light source 21 serves to provide light having a wavelength and illumination intensity desired for the wafer edge exposure process. The power of the light source may be adjustable by a controller to a level providing desired illuminance on the wafer surface, and the light may be output with a numerical aperture matched with a numerical aperture of the downstream fiber optic cable 22. In order to address the need for light in different wavelength bands, the light source 21 may emit light of wavelengths essentially of 365 nm, 405 nm and 436 nm. The fiber optic cable 22 is configured to collect light emanated from the light source at a certain angle and with a desired energy level and transmit the collected light. The light homogenizer 23 is adapted to homogenize the light to ensure that its irradiation on the wafer surface results in a light spot with a uniform energy distribution. Preferably, according to the present invention, the light homogenizer 23 may be selected as a quartz rod. The exposure assembly 24 forms an image of an illuminated object on a desired area of the wafer surface to enable the wafer edge exposure process.

Figure 4:
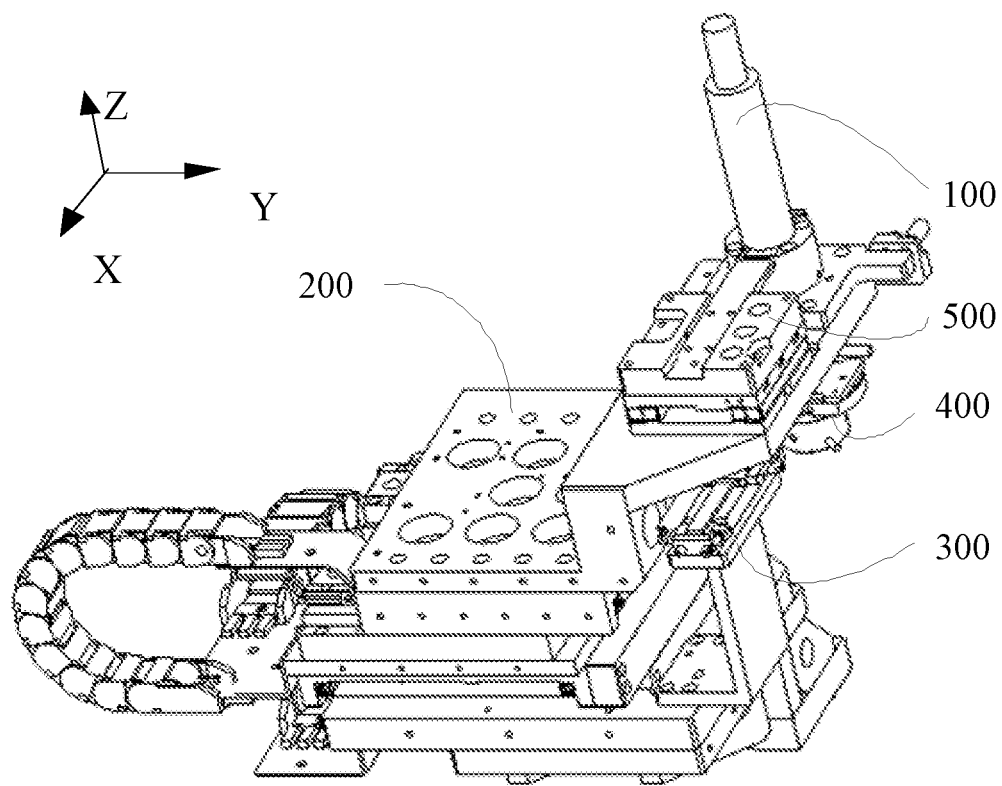
FIG. 4 is a structural schematic of an exposure assembly according to a particular embodiment of the present invention.

With particular reference to FIG. 4, the exposure assembly 24 may include a motion switching/adjusting mechanism 200 for exposure mode switching and translational motion and, disposed on the motion switching/adjusting mechanism 200, an exposure lens 100, an absolute light intensity detection mechanism 300, an exposure dose measuring mechanism 400 and a diaphragm switching mechanism 500.

Figure 5:
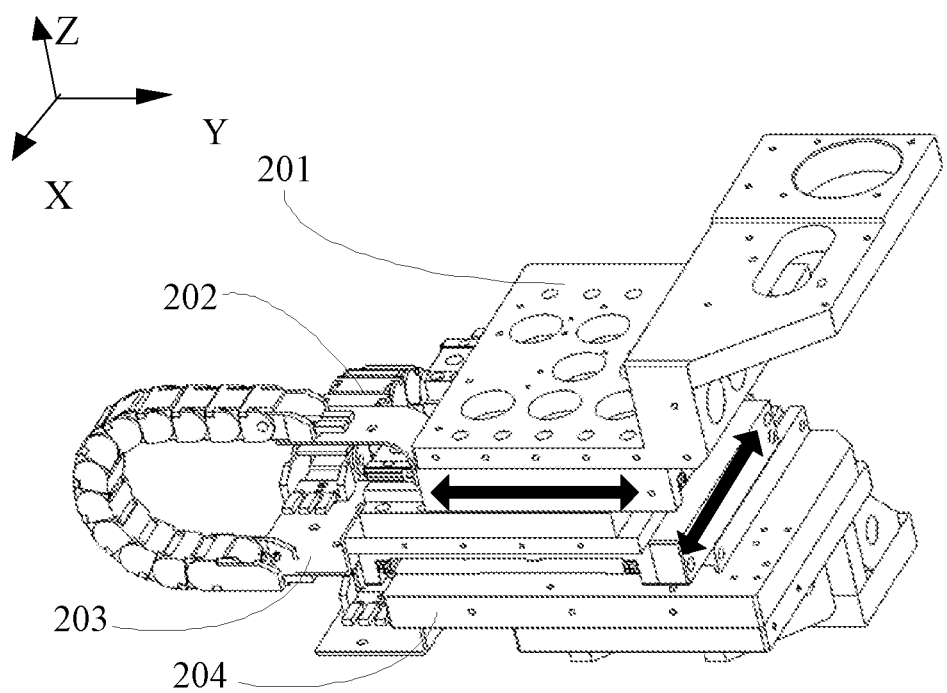
FIG. 5 is a structural schematic of a motion switching/adjusting mechanism according to a particular embodiment of the present invention.

With particular reference to FIG. 5, the motion switching/adjusting mechanism 200 for exposure mode switching and translational motion may include essentially: a motion module mount 204; a planar motion module 202 mounted on the motion module mount 204; and a towline assembly 203 and a module adapter plate 201, both coupled to the planar motion module 202. The exposure lens 100 is mounted on the module adapter plate 201.

Referring to FIGS. 4 and 5, the module adapter plate 201 may be driven by the planar motion module 202 and thus have freedom of movement in both the X and Y directions. Specifically, the planar motion module 202 may drive the module adapter plate 201 to perform long-stroke movements in the X direction as required for the exposure of wafers of different sizes. In addition, the planar motion module 202 may also drive the module adapter plate 201 to perform long-stroke movements in the Y direction to enable flat-edge exposure and linear exposure. In particular, in order to switch from a 12-inch wafer exposure mode to an 8-inch wafer exposure mode, the planar motion module 202 may drive the exposure lens 100 to move in position along the X direction. In case of linear exposure, it may be first driven to move to a predetermined start point and then along the Y direction.

Figure 6:
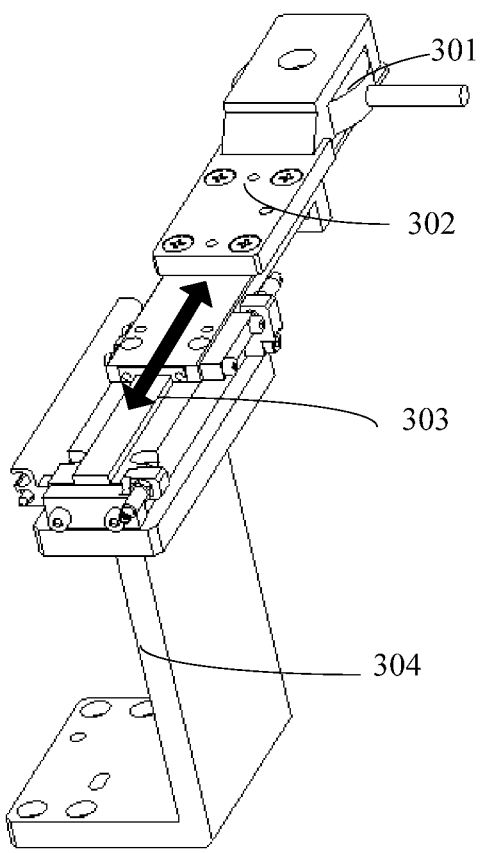
FIG. 6 is a structural schematic of an absolute light intensity detection mechanism according to a particular embodiment of the present invention.

As shown in FIG. 6, the absolute light intensity detection mechanism 300 may include a cylinder adapter 304, a switching cylinder 303, a sensor mount 302 and a light intensity sensor 301. The switching cylinder 303 is coupled to the motion module mount 204 through the cylinder adapter 304. The light intensity sensor 301 is coupled to the switching cylinder 303 through the sensor mount 302 into alignment with a field of view (FoV) of the exposure lens 100. The light intensity sensor 301 may translate with the switching cylinder 303 in the X direction in order to switch between different modes. Specifically, in order to switch from an exposure mode to a detection mode, the planar motion module 202 may transport the exposure lens 100 to a predetermined position, and the diaphragm switching mechanism 500 may drive a masking diaphragm to a position corresponding to a maximum FoV. The switching cylinder 303 may then advance the light intensity sensor 301 along the X direction into a target area of the wafer, where it performs light intensity verification and validation. After the completion of the detection, the switching cylinder 303 may evacuate the light intensity sensor 301 from the target area along the X direction, and the exposure lens 100 may be driven back therein by the planar motion module 202 along the X and Y directions, enabling switching back to the exposure mode.

Figure 7:
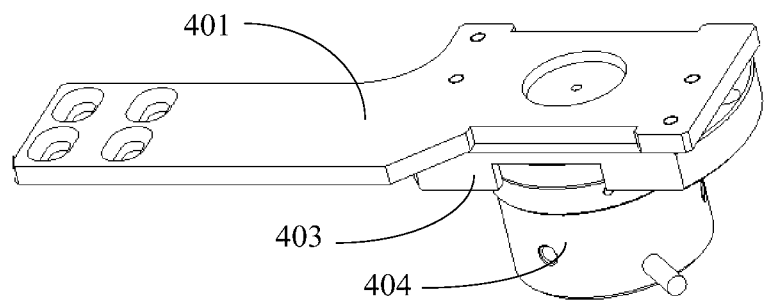
FIG. 7 is a structural schematic of an exposure dose measuring mechanism according to a particular embodiment of the present invention.
Figure 8:
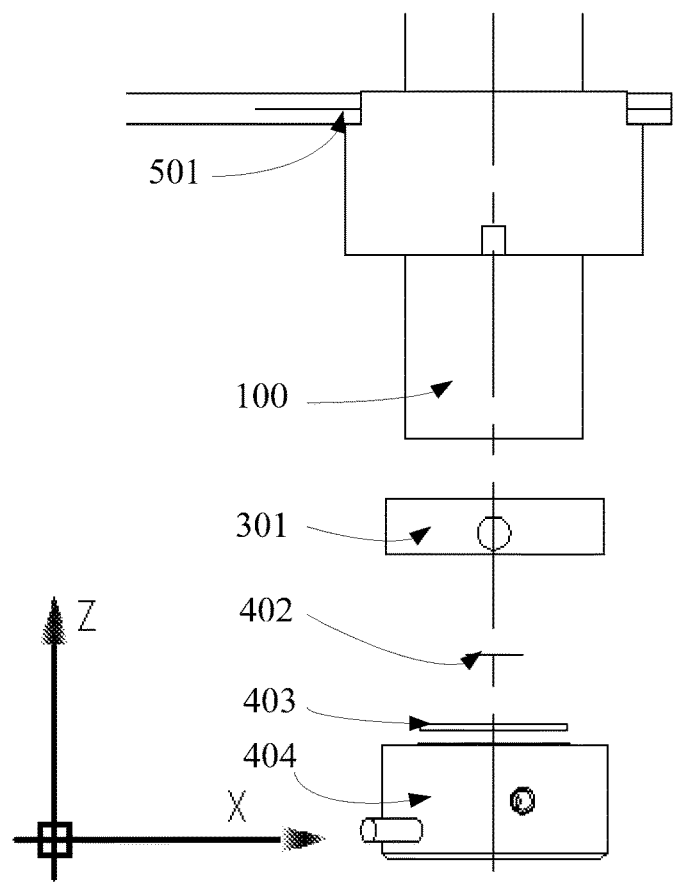
FIG. 8 is a schematic illustration of a vertical arrangement of an edge exposure apparatus according to a particular embodiment of the present invention.

As shown in FIGS. 7 and 8, the exposure dose measuring mechanism 400 may include an adjusting/mounting plate 401, a pinhole 402, a filter 403 and an illuminance sensor 404. The illuminance sensor 404 is fastened to the module adapter plate 201 through the adjusting/mounting plate 401, and both the pinhole 402 and the filter 403 are disposed between the adjusting/mounting plate 401 and the illuminance sensor 404. The exposure dose measuring mechanism 400 may move with the exposure lens 100 and monitor its adjustment within a small range. The exposure dose measuring mechanism 400 is configured to measure an exposure dose and is located horizontally between edges of the wafer and of the exposure field of view. As such, exposure illuminance monitoring is enabled during the exposure process.

It should be noted that, in order to achieve effective and robust illuminance monitoring, in addition to calibration of the exposure dose measuring mechanism 400 by the absolute light intensity detection mechanism 300, computational compensation is usually also applied to measurements of the exposure dose measuring mechanism 400. In order to make the light intensity detection position 700 flush with the wafer exposure position in the Z direction, the illuminance sensor 404 is disposed under the light intensity sensor 301 so that after withdrawal of the light intensity sensor 301 along the X direction, the illuminance sensor 404 still stays at the illuminance detection position, making the two measures compatible with each other.

Figure 9:
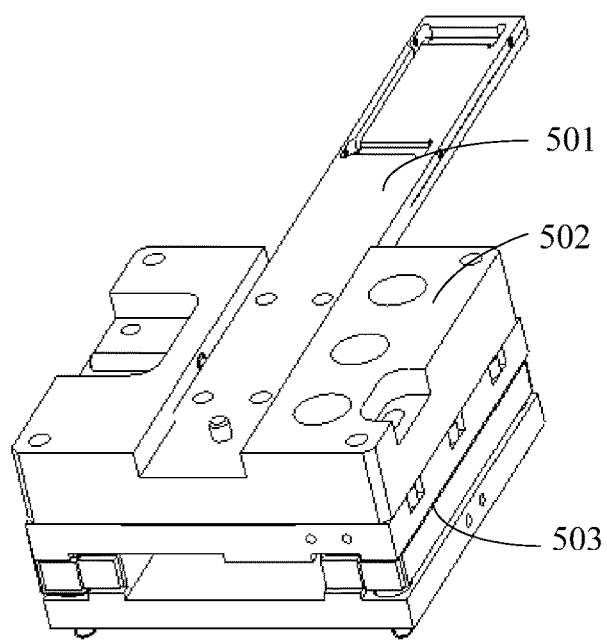
FIG. 9 is a structural schematic of a diaphragm switching mechanism according to a particular embodiment of the present invention.

As shown in FIG. 9, the diaphragm switching mechanism 500 may include a linear motion module 503 in fixed connection with the module adapter plate 201, a guiding block 502 disposed on the linear motion module 503, and a masking diaphragm 501 coupled to the guiding block 502. The masking diaphragm 501 is disposed on the exposure lens 100. The masking diaphragm 501 has multiple diaphragm apertures. In other words, according to the present invention, when the linear motion module 503 moves the masking diaphragm 501 in the X direction, a vertical positional relationship between the diaphragm apertures and the field of view of the exposure lens 100 will vary, making it possible to restrict and tailor the size of the exposure area.

With particular reference to FIGS. 10 to 16, the edge exposure apparatus of the present invention is capable of switching between exposure areas and stepless tailoring of them to address edge exposure of wafers of different sizes in the range of 8 inch to 12 inch.

Figure 10:
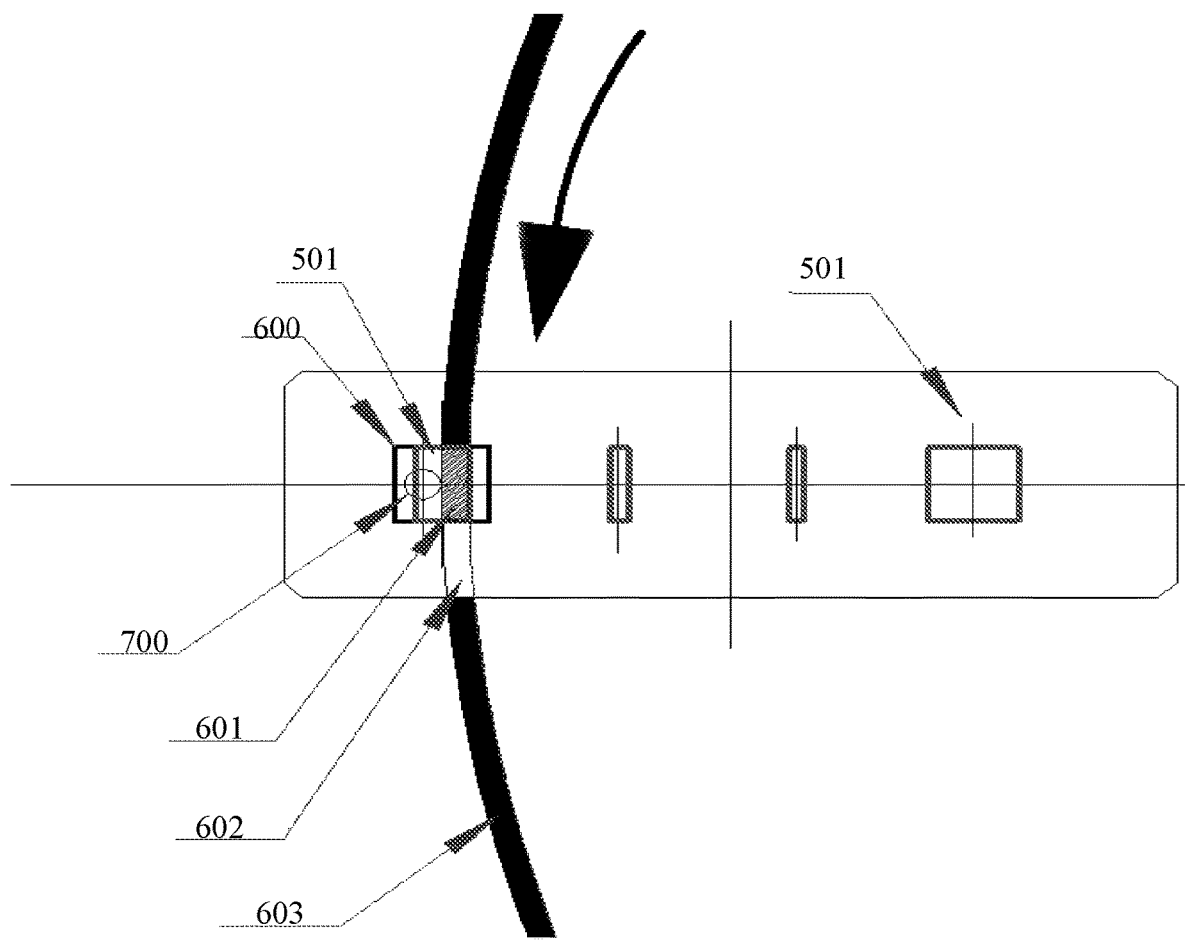
FIG. 10 is a schematic illustration of an edge exposure apparatus according to a particular embodiment of the present invention, which is performing an exposure process.
Figure 11:
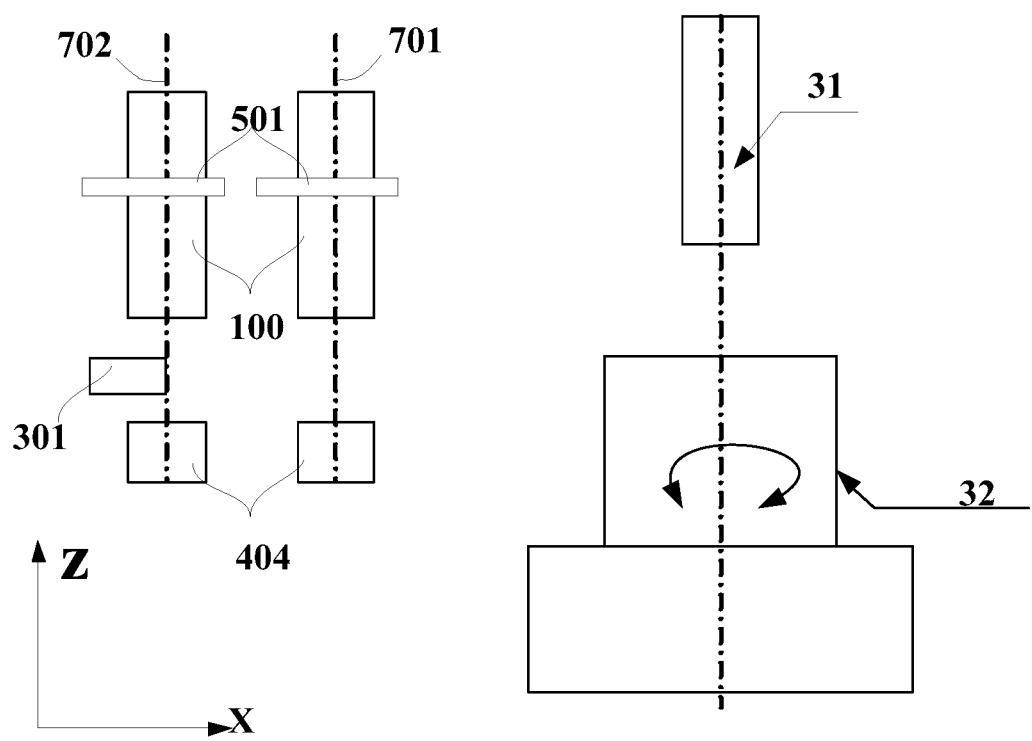
FIG. 11 is a schematic illustration of an overall vertical arrangement of an edge exposure apparatus according to a particular embodiment of the present invention in operation.
Figure 12:
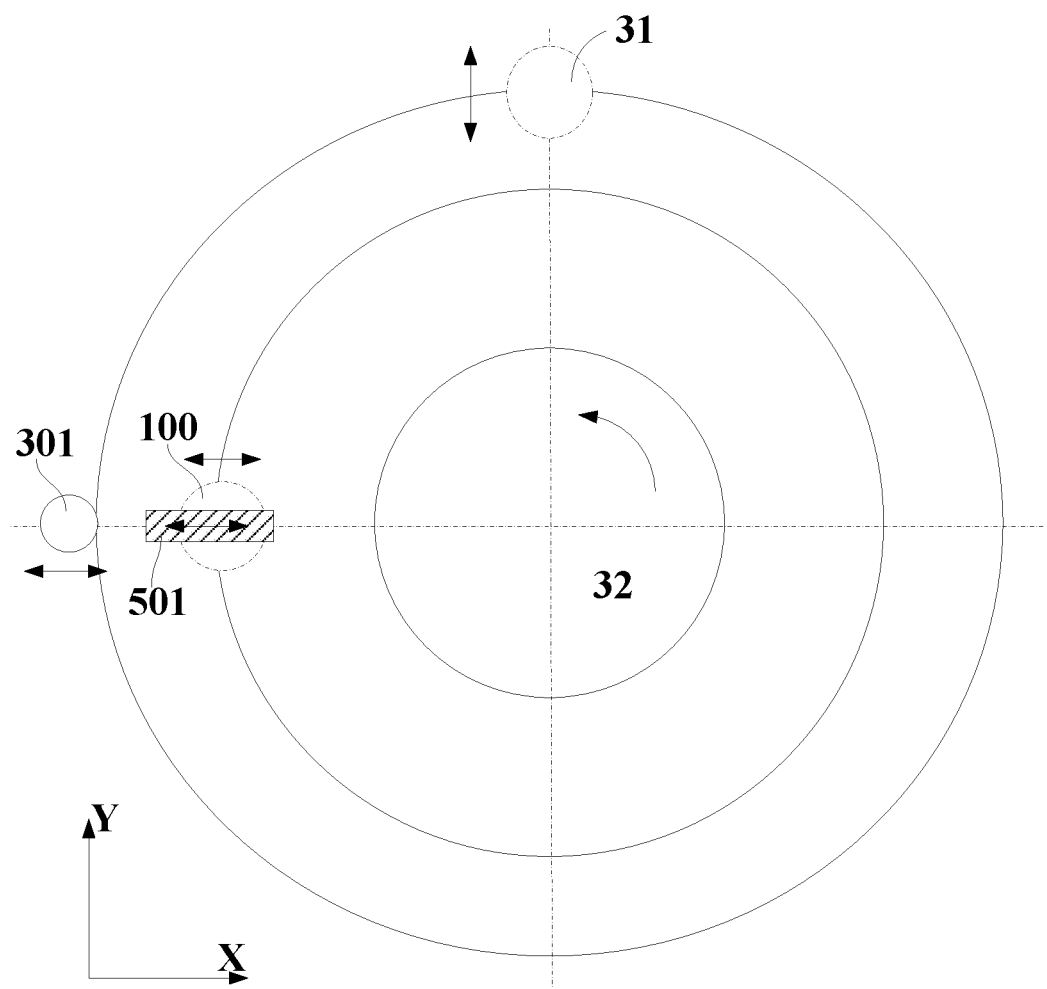
FIG. 12 is a schematic illustration of an overall horizontal arrangement of an edge exposure apparatus according to a particular embodiment of the present invention in operation.

As shown in FIGS. 10, 11 and 12, this is explained below with the switching between an 8-inch wafer exposure configuration 701 and a 12-inch wafer exposure configuration 702 as an example.

At first, a 12-inch wafer is placed on the rotary table 32, followed by location and detection by the mechanical vision system 31 for ensuring pre-alignment of the 12-inch wafer on the rotary table 32. The planar motion module 202 then advances the exposure lens 100 along the X direction to a predetermined position corresponding to the 12-inch wafer exposure configuration 702. The edge exposure system is activated to allow light from the light source to be directed by the optical system vertically onto the exposure lens 100. At the same time, the rotary table 32 rotates so that an edge of the 12-inch wafer is exposed. As shown, an FoV of the exposure lens 100 is indicated at 600, an exposed section of the edge of the 12-inch wafer at 603, an edge section being exposed within the FoV 600 at 601, and an edge section to be subsequently exposed at 602. After the edge exposure process is completed, the 12-inch wafer is removed.

Subsequently, an 8-inch wafer is placed on the rotary table 32, and the planar motion module 202 delivers the exposure lens 100 along the X direction to a position corresponding to the 8-inch wafer exposure configuration 701. That is, the 12-inch wafer exposure configuration 702 has been switched to the 8-inch wafer exposure configuration 701. The edge exposure system is then activated and the rotary table 32 is rotated to expose an edge of the 8-inch wafer.

Next, with a wafer having a radius of R as an example, and with reference to Table 1, a detail description will be given below on how the present invention enables multiple exposure modes including linear exposure, edge exposure, annular exposure, segment-wise exposure, etc.

TABLE 1

| Various Exposure Modes | |
| --- | --- |
| Edge exposure | Width adjustability: achieved by movement of the planar motion module 202 in the X direction. |
| Annular exposure | Position adjustability: achieved by movement of the planar motion module 202 in the X direction. Width adjustability: achieved by movement of the linear motion module 503 in the X direction. |
| Segment-wise exposure | Angle adjustability: achieved by angle control by the rotary table 32 and exposure time control by the controller for the light source. Position adjustability: achieved by movement of the planar motion module 202 in the X direction. Width adjustability: achieved by movement of the linear motion module 503 in the X direction. |
| Linear exposure (position adjustability, length adjustability and width adjustability) | Position adjustability: achieved by movement of the planar motion module 202 in the X direction. Length adjustability: achieved by movement of the planar motion module 202 in the Y direction. Width adjustability: achieved by movement of the linear motion module 503 in the X direction. |
| Switching between 8-inch and 12-inch wafer exposure configuration | Achieved by movement of the planar motion module 202 in the X direction. |

Figure 13:
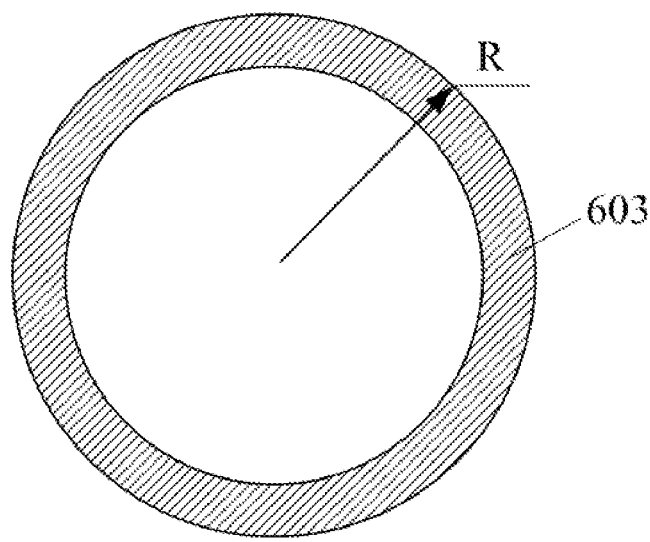
FIG. 13 schematically illustrates an edge exposure mode according to a particular embodiment of the present invention.

FIG. 13, in conjunction with Table 1, shows the edge exposure mode, in which the planar motion module 202 drives the exposure lens 100 to move along the X direction to a predetermined position corresponding to a controlled distance between the exposure lens 100 and the wafer edge so that the wafer edge is exposed at a desired width.

Figure 14:
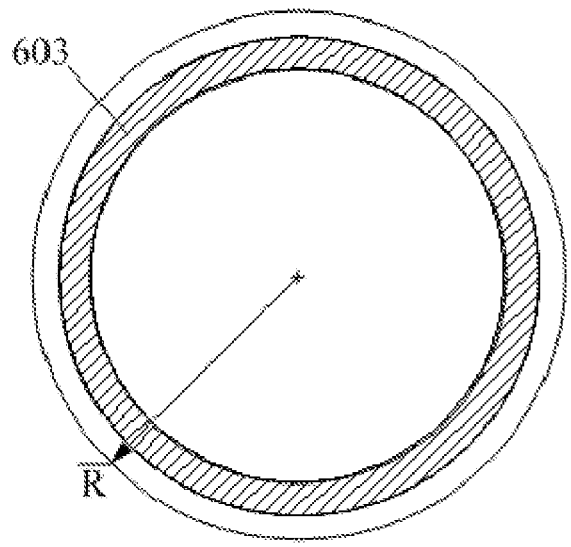
FIG. 14 schematically illustrates an annular exposure mode according to a particular embodiment of the present invention.

FIG. 14 shows the annular exposure mode in which the planar motion module 202 drives the exposure lens 100 to move along the X direction to a predetermined position corresponding to a controlled distance between the exposure lens 100 and the wafer center (i.e., position adjustability), and the linear motion module 503 then drives the masking diaphragm 501 to select an appropriate one of the diaphragm apertures (i.e., width adjustability).

Figure 15:
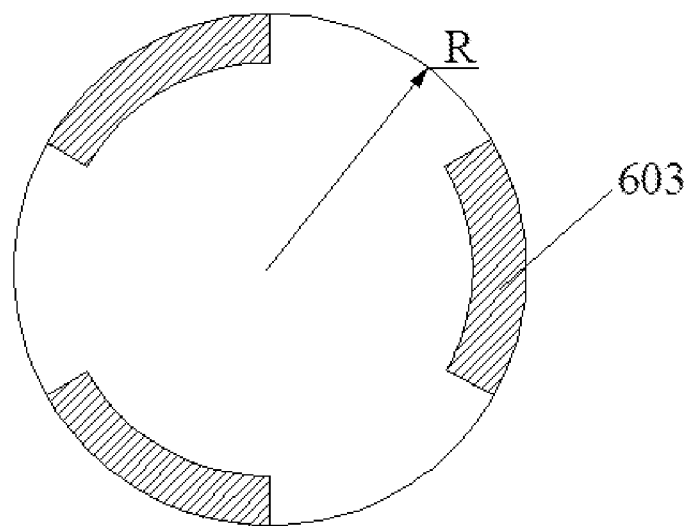
FIG. 15 schematically illustrates a segment-wise exposure mode according to a particular embodiment of the present invention.

FIG. 15 shows the segment-wise exposure mode in which the planar motion module 202 drives the exposure lens 100 to move along the X direction to a predetermined position corresponding to a controlled distance between the exposure lens 100 and the wafer center (i.e., position adjustability), followed by selecting an appropriate one of the diaphragm apertures through moving the masking diaphragm 501 by the linear motion module 503 (i.e., width adjustability).

During exposure, the rotary table 32 rotates the wafer by controlled angles, with the controller for the light source performing exposure time control.

Figure 16:
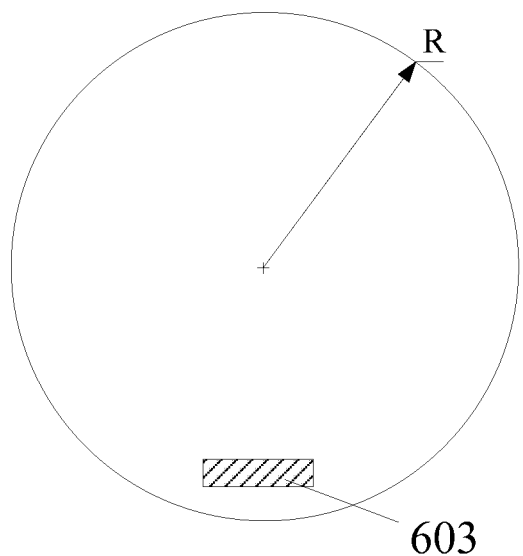
FIG. 16 schematically illustrates a linear exposure mode according to a particular embodiment of the present invention.

FIG. 16 shows the linear exposure mode in which the planar motion module 202 transports the exposure lens 100 both in the X and Y directions to a start point for the linear exposure process, followed by selecting an appropriate one of the diaphragm apertures through moving the masking diaphragm 501 by the linear motion module 503 (i.e., width adjustability). The linear exposure process is then carried out, in which the planar motion module 202 moves the exposure lens 100 in the Y direction. This linear exposure mode also allows flat-edge exposure.

With particular reference to FIGS. 10 to 12, when viewed from the top, illuminance detection is conducted between the edges of the wafer and of the exposure field of view, enabling real-time illuminance monitoring of the exposure process. The exposure dose measuring mechanism 400, which is additionally employed in accordance with the present invention compared to the conventional systems, ensures normal exposure operation and allows real-time detection of illuminance conditions during the operation.

Further, the module adapter plate 201 is a stair-like structure having an upper plate and a lower plate spaced apart from the upper plate by a distance in the vertical direction. The lower plate is fastened to the planar motion module 202, while the upper plate provides a platform on which the exposure lens 100, the exposure dose measuring mechanism 400 and the diaphragm switching mechanism 500 are mounted. This results in structural simplification and savings in material. Disposing the illuminance sensor 404 under the light intensity sensor 301 allows coincidence of the light intensity detection position 700 with the wafer exposure position in the Z direction, while not affecting the monitoring by the illuminance sensor 404. As a result, reasonable space utilization is achieved, facilitating movement relative to, and exposure of, the wafer.

Figure 17:
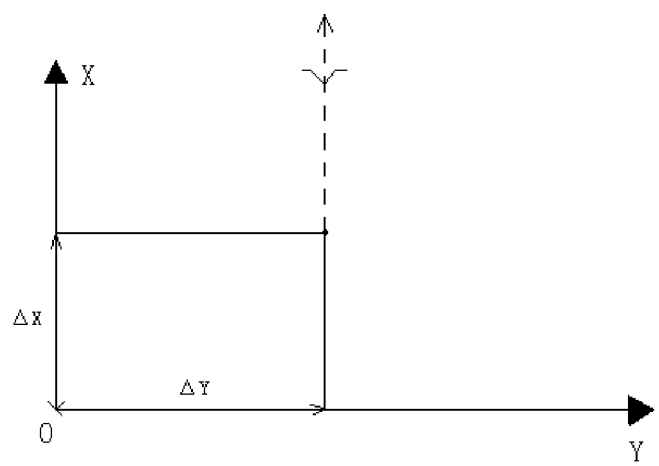
FIG. 17 explains how an edge exposure apparatus according to a particular embodiment of the present invention performs a wafer pre-alignment process.
Figure 18:
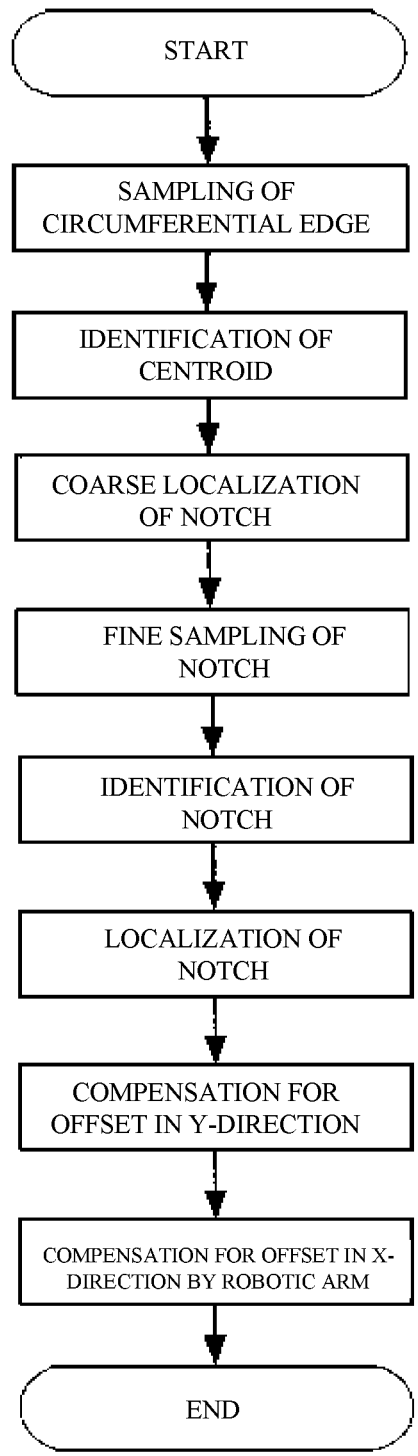
FIG. 18 is a flowchart of a pre-alignment process performed by an edge exposure apparatus according to a particular embodiment of the present invention.
Figure 19:
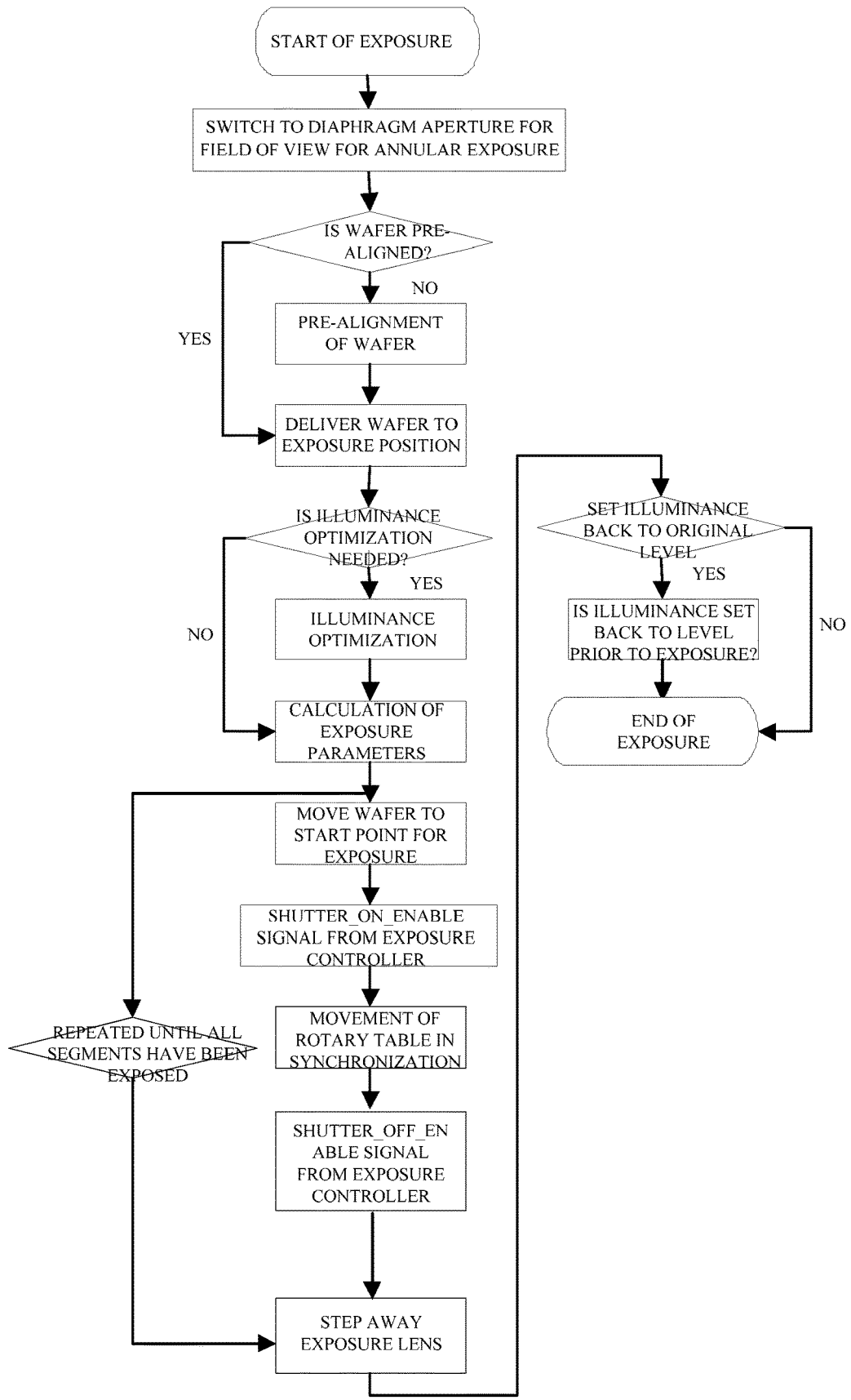
FIG. 19 is a flowchart of an edge exposure method according to a particular embodiment of the present invention.

Referring to FIGS. 17 to 19, in conjunction with FIGS. 1 to 16, the present invention also provides an edge exposure method, including:

taking out a wafer from the cassette unit 4 and placing it onto the rotary table 32 of the pre-alignment unit 3, by the robotic arm 5;

centering and orienting the wafer by the pre-alignment unit 3, wherein as shown in FIGS. 17 and 18, this includes the steps of: finding a centroid of the wafer by scanning and sampling a circumferential edge of the wafer with the mechanical vision system 31; preliminarily locating and finely sampling a notch in the wafer with the mechanical vision system 31 and thereby identifying a center of the notch; orienting the notch, by the rotary table 32, to such a predetermined position that a line leading from the centroid of the wafer toward the center of the notch defines a positive X direction; and determining offsets Δx and Δy of the centroid of the wafer from a centroid of the rotary table;

moving the centering/orienting member 33 by the rotary table 32 in the Y direction to compensate for the offset Δy; and picking up the wafer and moving it in the X direction, by the robotic arm 5, to compensate for the offset Δx.

In particular, compensation for the offset Δx by the robotic arm 5 may include: communicating the offset Δx to the robotic arm 5; and moving the wafer by a distance of m+Δx or m−Δx and placing it onto the rotary table 32, by the robotic arm 5, where m denotes a constant distance the robotic arm 5 regularly need to move before it hands over the wafer to the rotary table 32 (i.e., the exposure table).

Next, the edge exposure unit 2 performs an edge exposure process on the centered and oriented wafer, and the exposed wafer is then removed by the robotic arm. Of course, the edge exposure process is carried out on the same pre-alignment table (rotary table 32) where the wafer was pre-aligned by the pre-alignment unit.

FIG. 19 shows a flowchart of the edge exposure process.

At first, one of the diaphragm apertures that can result in a desired exposure field of view for a desired exposure mode is selected.

It is determined whether the wafer has been pre-aligned. If not, the wafer is pre-aligned. Otherwise, the wafer is delivered to the exposure position.

Illuminance optimization and calculation of exposure parameters are carried out.

All the required segments of the wafer are then exposed in respective cycles. Of course, at the beginning and end of this process, a shutter of an exposure controller is controlled to be opened and closed, respectively, in synchronization with the rotation of a rotary shaft.

Afterward, the exposure lens is stepped forward, and the illuminance is set back to the original level, completing the exposure process.

It should be noted that, in the edge exposure process performed by the edge exposure apparatus of the present invention, exposure dose control depends on illuminance, scanning speed, FoV and wafer size. A given dose can be achieved by setting these parameters according to:

$$dDose = I*dt = I*\frac{dl}{v} = I*\frac{W}{v}$$

where, I represents illuminance; dl, FoV size; v, scanning speed; and W, wafer perimeter.

Apparently, among these parameters, in addition to the given dose dDose, the wafer size is known and the FoV size l is constant. Therefore, only the illuminance I (the light source integrates a set of attenuators which can attenuate the illuminance of the light source in several levels) and the scanning speed v are controllable variables.

A practical edge exposure process involves detecting an actual dose applied on the wafer surface in order to assess whether it is equal to a given target dose and stable. In the edge exposure process performed by the edge exposure apparatus of the present invention on the centered and oriented wafer, light straying from the exposure path may be cumulatively collected and serves as a basis for calculating the actual exposure dose and thus for determining whether the current exposure process has encountered an abnormality. If so, an alert may be raised. In general terms, for different batches of wafers processed by the same process, the amount of stray light and the actual exposure dose are consistent.

Thus, for any wafer, the actual exposure dose may be measured, and after the exposure process, the actual and target doses may be compared by software to determine whether the exposure process has encountered an abnormality. If so, an alert may be raised promptly to minimize the production risk.

Furthermore, in the process performed in the edge exposure, segment-wise exposure, annular exposure or linear exposure mode, delays tend to occur during the opening and closing of the shutter in the exposure controller, which may lead to insufficient or excessive exposure at the beginning or end of the exposure process. In order to maximize the synchronization of the opening and closing of the shutter in the exposure controller with the rotation of the rotary shaft at the beginning and end of the exposure process, an exposure control method is also provided, including:

issuing a shutter_on_enable signal at a shutter_on_delay duration encompassing shutter-on 3-sigma values, prior to the exposure of a predetermined point, thereby ensuring that the shutter is truly opened at the beginning of the exposure of the predetermined point; and issuing a shutter_off_enable signal at a period of time equal to (shutter_on_delay+ exposure duration−shutter_off_delay), thereby ensuring that the shutter is truly opened at the end of the exposure operation.

In particular, the following steps may be performed:
1. setting an offset during initialization;
2. during edge exposure, starting exposure dose assessment once the shutter is triggered to start opening by the shutter_on_enable signal; and
3. ending the exposure dose assessment after the shutter has been closed and obtaining an exposure dose for the previous cycle.

In this way, an accurate exposure dose can be obtained for every exposure cycle.

It is apparent that those skilled in the art can make various modifications and variations to the present invention without departing from the spirit and scope thereof. Accordingly, the invention is intended to embrace all such modifications and variations if they fall within the scope of the appended claims and equivalents thereof.

What is claimed is:

1. An edge exposure apparatus, comprising: a base frame; an edge exposure unit mounted on the base frame and configured to perform an edge exposure process on a wafer; a pre-alignment unit for centering and orienting the wafer and cooperating with the edge exposure unit in the edge exposure process; a cassette unit for storing and detecting the wafer; a robotic arm for transferring the wafer; and a master control unit for controlling the above units, wherein the edge exposure unit and the pre-alignment unit share a common worktable, wherein the edge exposure unit comprises a light source, a fiber optic cable, a light homogenizer and an exposure assembly which are disposed along a direction in which light propagates, wherein the exposure assembly comprises:

a motion switching/adjusting mechanism, having freedoms of movement in horizontal X and Y directions;

an exposure lens mounted on the motion switching/adjusting mechanism, the exposure lens configured to perform the edge exposure process on the wafer;

an absolute light intensity detection mechanism mounted on the motion switching/adjusting mechanism, the absolute light intensity detection mechanism configured for verification and validation of a light intensity in an area being exposed;

an exposure dose measuring mechanism mounted on the motion switching/adjusting mechanism, the exposure dose measuring mechanism configured to monitor an illuminance during the edge exposure process; and a diaphragm switching mechanism disposed in positional correspondence with the exposure lens, and wherein the motion switching/adjusting mechanism is configured to switch the wafer between an exposure mode and a pre-alignment mode and to enable translational movement of the wafer.

2. The edge exposure apparatus of claim 1, wherein the motion switching/adjusting mechanism comprises a motion module mount, a planar motion module mounted on the motion module mount as well as a towline assembly and a module adapter plate both coupled to the planar motion module, wherein the exposure lens is mounted on the module adapter plate, and the module adapter plate has freedoms of movement in the horizontal X and Y directions.

3. The edge exposure apparatus of claim 2, wherein the absolute light intensity detection mechanism comprises a cylinder adapter, a switching cylinder, a sensor mount and a light intensity sensor, the switching cylinder coupled to the motion module mount through the cylinder adapter, the light intensity sensor coupled to the switching cylinder through the sensor mount and aligned with a field of view of the exposure lens.

4. The edge exposure apparatus of claim 2, wherein the exposure dose measuring mechanism comprises an adjusting/mounting plate, a pinhole, a filter and an illuminance sensor, the illuminance sensor fastened to the module adapter plate through the adjusting/mounting plate, the pinhole and the filter disposed between the adjusting/mounting plate and the illuminance sensor.

5. The edge exposure apparatus of claim 2, wherein the diaphragm switching mechanism comprises a linear motion module in fixed connection with the module adapter plate, a guiding block disposed on the linear motion module and a masking diaphragm coupled to the guiding block, the masking diaphragm disposed on the exposure lens.

6. The edge exposure apparatus of claim 1, wherein the pre-alignment unit comprises a mechanical vision system, a rotary table and a centering/orienting member, the rotary table disposed on the centering/orienting member and configured to support the wafer, the mechanical vision system being in positional correspondence with the rotary table.

7. The edge exposure apparatus of claim 1, comprising two edge exposure units and two pre-alignment units.

8. An edge exposure method using the edge exposure apparatus of any one of claim 1, comprising:

taking out a wafer from a cassette unit and placing the wafer onto a pre-alignment unit, by a robotic arm;

centering and orienting the wafer by the pre-alignment unit;

performing an edge exposure process on the centered and oriented wafer by an edge exposure apparatus; and removing the exposed wafer.

9. The edge exposure method of claim 8, wherein centering and orienting the wafer by the pre-alignment unit comprises:

obtaining, by fitting, a centroid of the wafer by scanning and sampling a circumferential edge of the wafer;

locating and sampling a notch in the wafer and thereby obtaining, by fitting, a center of the notch;

moving the notch, by rotation, to a predetermined position, such that a line leading from the centroid of the wafer toward the center of the notch is parallel to a positive X direction, and determining an offset of the centroid of the wafer; and compensating for the offset of the centroid of the wafer by adjusting the wafer.

10. The edge exposure method of claim 8, wherein in the step of performing the edge exposure process on the centered and oriented wafer by the edge exposure apparatus, an actual expose dose applied to a surface of the wafer is estimated by edge exposure residual light collection and cumulative calculation, and wherein the actual expose dose serves as a basis for determining whether the edge exposure process has encountered an abnormality, and if so, an alert is raised.

\* \* \* \* \*